United States Patent
Xi et al.

(10) Patent No.: US 12,268,013 B2
(45) Date of Patent: Apr. 1, 2025

(54) HIGH-RESISTANCE RESISTOR BASED ON SILICON CARBIDE AND MANUFACTURING METHOD THEREOF

(71) Applicants: Taiyuan University of Technology, Taiyuan (CN); Institute of New Materials and Chemical Engineering, Zhejiang University, Shanxi, Taiyuan (CN)

(72) Inventors: Yuying Xi, Jinzhong (CN); Yanxia Cui, Jinzhong (CN); Kun Hu, Jinzhong (CN); Yuan Tian, Jinzhong (CN); Guohui Li, Jinzhong (CN); Bingshe Xu, Jinzhong (CN)

(73) Assignees: Taiyuan University of Technology, Taiyuan (CN); Institute of New Materials and Chemical Engineering, Zhejiang University, Shanxi, Taiyuan (CN)

( * ) Notice: Subject to any disclaimer, the term of this patent is extended or adjusted under 35 U.S.C. 154(b) by 482 days.

(21) Appl. No.: 17/885,570

(22) Filed: Aug. 11, 2022

(65) Prior Publication Data

US 2023/0317770 A1  Oct. 5, 2023

(30) Foreign Application Priority Data

Mar. 23, 2022  (CN) .......................... 202210294747.7

(51) Int. Cl.
- *H01L 49/02* (2006.01)
- *H01L 21/02* (2006.01)
- *H10D 1/47* (2025.01)

(52) U.S. Cl.
CPC ....... *H10D 1/472* (2025.01); *H01L 21/02052* (2013.01); *H01L 21/02178* (2013.01); *H01L 21/02266* (2013.01); *H01L 21/0228* (2013.01)

(58) Field of Classification Search
None
See application file for complete search history.

(56) References Cited

U.S. PATENT DOCUMENTS

2020/0051717 A1* 2/2020 Nakamura ............... H01C 1/01
2024/0416310 A1* 12/2024 Ambrosetti ............. B01J 8/009

* cited by examiner

*Primary Examiner* — Asok K Sarkar
(74) *Attorney, Agent, or Firm* — Bayramoglu Law Offices LLC

(57) ABSTRACT

Disclosed is a high-resistance resistor based on silicon carbide. The resistor includes a semi-insulating 4H—SiC silicon carbide substrate, a silicon surface and a carbon surface of the silicon carbide substrate are provided with symmetrical atomic-thickness aluminum oxide insulating layers, thicknesses of the aluminum oxide insulating layers are 0.2 nm-2 nm, conductive metal electrodes are formed at two sides of the aluminum oxide insulating layers through evaporation, and thicknesses of the metal electrodes are 100 nm-500 nm. The present disclosure uses a high-resistance resistor based on silicon carbide that has the above structure, makes an ohmic contact electrode on a semi-insulating silicon carbide substrate, thus obtaining a resistor with a resistance of 100 TΩ or more, and satisfying requirements of the precision measurement industry.

4 Claims, 2 Drawing Sheets

HIGH-RESISTANCE RESISTOR BASED ON SILICON CARBIDE AND MANUFACTURING METHOD THEREOF

CROSS REFERENCE TO THE RELATED APPLICATIONS

This application is based upon and claims priority to Chinese Patent Application No. 202210294747.7, filed on Mar. 23, 2022, the entire contents of which are incorporated herein by reference.

TECHNICAL FIELD

The present disclosure belongs to the technical field of semiconductor resistor elements, and particularly relates to a high-resistance resistor based on silicon carbide and a manufacturing method therefor.

BACKGROUND

A resistor, made by using a certain effect that a current is blocked when flowing through a substance, can limit a current in a circuit. A resistor, a two-terminal electronic element, which is the most important type of elements in an electronic circuit, can be used as a current divider and a voltage divider in a circuit, as well as a load matching the circuit. There are many kinds of resistors in the current market. According to resistance characteristics, resistors can be divided into fixed resistors, adjustable resistors, sensitive resistors, etc. A resistor has a wide range of resistance, which can be as low as 1 mΩ or as high as 100 TΩ.

A high-resistance resistor is widely used, especially in micro-current detection and generation. A process of exploring the micro-current world by human beings from a pA level to an fA level to an aA level has now entered an era of a single electron. A high-resistance resistor is a necessary element for successful micro-current detection, and an insulation leakage resistance of a micro-current detection circuit must be several orders of magnitude higher than a Thevenin equivalent resistance of a circuit under test. In addition, a precise weak current cannot be generated without a high-resistance resistor. When a measured current is more precise, or a weaker current is required, a resistor with a higher resistance must be used. Obviously, the measurement and generation accuracy of a current directly depend on a resistance of a resistor. For example, a resistor with a resistance of 100 GΩ is required for measurement of a current of 1 pA, a resistor with a resistance of 100 TΩ is required for measurement of a current of 1 fA, and a resistor with a resistance of 1 PΩ or more is required for measurement of a current of aA or lower.

A high-resistance resistor is usually made of a material with a high resistivity, such as metal oxide films and an organic material. Teflon, an organic material, is the most common resistor material in measurement of a current of 10 fA or more. Its main disadvantage is that when it is deformed, there will be charges inside it, which will cause false voltage and current. A volume resistivity of organic materials of polystyrene and polyethylene is close to that of Teflon, but a resistance of the polystyrene will decrease at a high humidity while that of the polyethylene will melt at a high temperature. Sapphire, the best insulating material, is often used in application of a current in a range of $10^{-18}$ A to $10^{-15}$ A. Its limiting factors are mainly high price and a complicated manufacturing process.

Silicon carbide, a wide-band-gap semiconductor, has desirable stability in extreme environments with a high temperature, high voltage, high frequency and strong radiation. There are two types of silicon carbide substrates, including a conductive type and a semi-insulating type. Semi-insulating silicon carbide has an extremely low intrinsic carrier concentration, and based on this, a high-resistance resistor can be developed. Compared with high-resistance elements made of other materials, a silicon-carbide-based high-resistance resistor, as an implementation solution of a high-resistance element, is compatible with a manufacturing process of a silicon carbide transistor, and is expected to realize a silicon carbide integrated circuit adapted to extreme environments, thus promoting significant innovation of the precision measurement technology in extreme environments. If a metal electrode is made directly on a silicon carbide substrate, Schottky contact will be obtained instead of ohmic contact. Silicon carbide two-terminal elements with Schottky contact at both the top and the bottom have nonlinear volt-ampere characteristics and cannot be used as high-resistance resistors. Therefore, making a metal electrode with an ohmic contact characteristic on a semi-insulating silicon carbide substrate is the key to obtain a high-resistance resistor.

SUMMARY

An objective of the present disclosure is to provide a high-resistance resistor based on silicon carbide and a manufacturing method thereof, which makes an ohmic contact electrode on a semi-insulating silicon carbide substrate, thus obtaining a resistor with a resistance of 100 TΩ or more, and satisfying requirements of the precision measurement industry.

To achieve the objective, the present disclosure provides a high-resistance resistor based on silicon carbide. The resistor includes a semi-insulating 4H—SiC silicon carbide substrate, a silicon surface and a carbon surface of the silicon carbide substrate are provided with symmetrical atomic-thickness aluminum oxide insulating layers, thicknesses of the aluminum oxide insulating layers are 0.2 nm-2 nm, conductive metal electrodes are formed at two sides of the aluminum oxide insulating layers through evaporation, and thicknesses of the metal electrodes are 100 nm-500 nm. Preferably, the metal electrodes are made of one or more of gold, silver, copper and aluminum.

A manufacturing method of a high-resistance resistor based on silicon carbide includes:

step 1: selecting a semi-insulating 4H—SiC silicon carbide substrate having a certain thickness and resistivity, and marking a carbon surface and a silicon surface of the substrate by means of an atomic force microscope;

step 2: cleaning and drying the silicon carbide substrate, and gently rubbing the carbon surface and the silicon surface of the silicon carbide substrate repeatedly by means of disposable gloves until the carbon surface and the silicon surface are washed with deionized water to form a uniform water film; and then placing the silicon carbide substrate in an ultrasonic cleaner, ultrasonically cleaning the silicon carbide substrate with deionized water, acetone and isopropanol separately for 15 min, and washing the silicon carbide substrate for later use;

step 3: using an atomic layer deposition technology or a magnetron sputtering technology to deposit 0.2 nm-2 nm of aluminum oxide insulating layers on the carbon surface and silicon surface of the silicon carbide substrate respectively;

step 4, sticking electrode masks on two sides of the deposited aluminum oxide insulating layers respectively, and determining covering areas of the electrode masks according to a resistance of a resistor to be manufactured;

step 5: placing silicon carbide having stuck masks in a cavity of a magnetron sputtering instrument, and spraying a layer of metal electrode having a thickness of 100 nm-500 nm on each of a carbon surface and a silicon surface of silicon carbide having deposited aluminum oxide through magnetron sputtering, where the metal electrodes are made of one or more of gold, silver, copper and aluminum; and step 6: taking out a sample from a coating chamber and removing the masks, so as to obtain the high-resistance resistor based on silicon carbide, and testing volt-ampere characteristics of the manufactured resistor by means of a semiconductor analyzer.

Compared with the prior art, the present disclosure has the following beneficial effects:

The silicon carbide is a highly stable semiconductor material, compared with traditional high-resistance materials, such as a metal oxide film and an organic material, the silicon carbide is capable of withstanding extreme environments having a high temperature, high voltage, high frequency, strong radiation, etc., and the high-resistance resistor based on silicon carbide is suitable for precision testing in an extreme environment.

Before the metal electrodes are made on the silicon carbide substrate, introduction of an atomic-thickness aluminum oxide interface modified layer is conducive to obtaining of a volt-ampere characteristic curve having an ohmic contact characteristic. Effective areas of the electrodes are adjusted to directly adjust the resistance. The high-resistance resistor obtained through the method is conducive to direct monolithic integration with a silicon carbide transistor, thus promoting development of a silicon carbide integrated circuit technology.

The technical solution of the present disclosure will be further described in detail below with reference to the accompanying drawings and the embodiments.

DETAILED DESCRIPTION OF THE EMBODIMENTS

Figure 1:
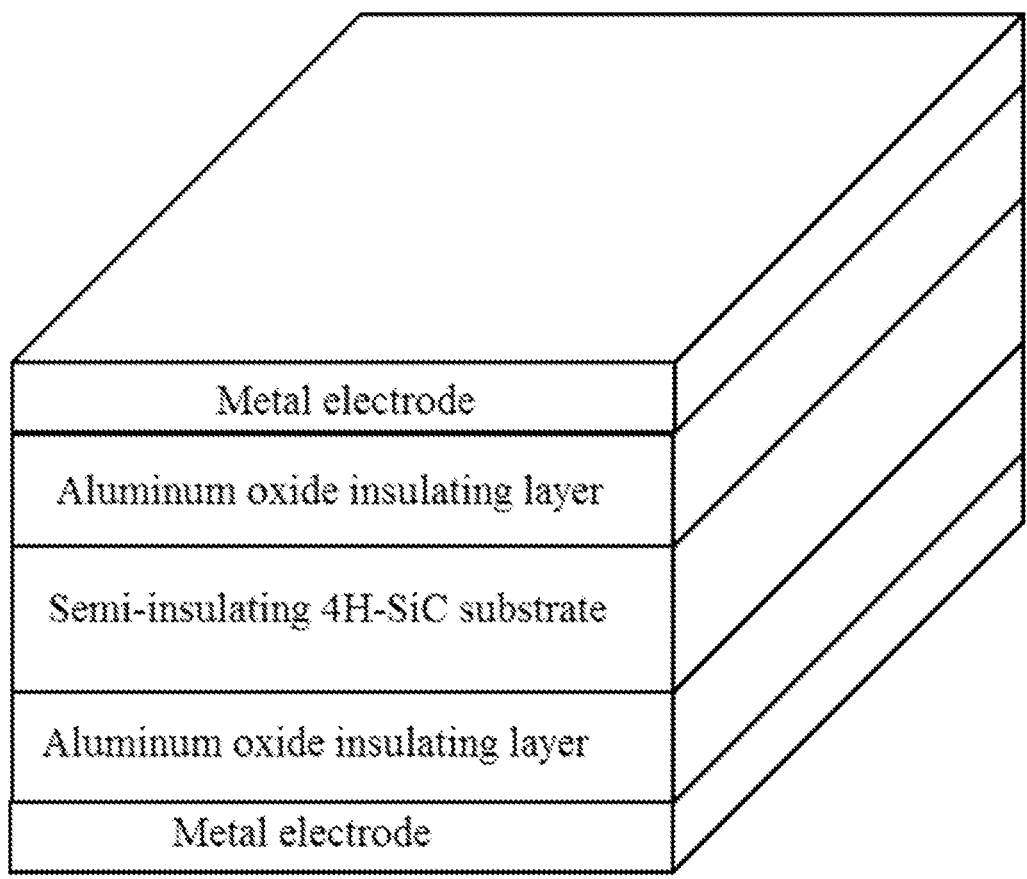
FIG. 1 is a structural schematic diagram of a high-resistance resistor based on silicon carbide of an embodiment in the present disclosure.
Figure 2:
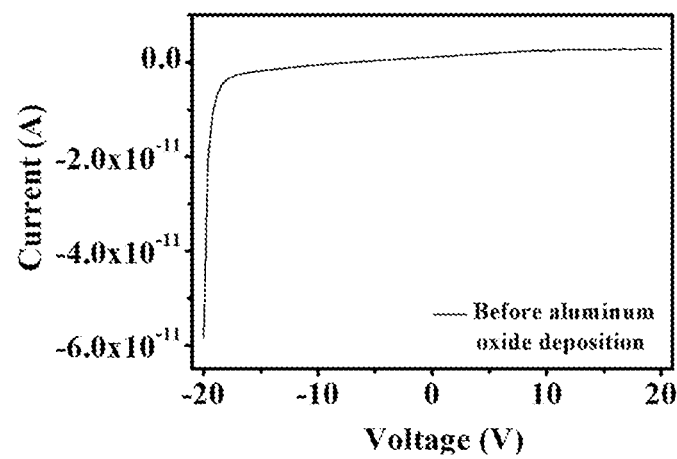
FIG. 2 is a current-voltage curve of a silicon carbide device before aluminum oxide deposition in the present disclosure.

The technical solution of the present disclosure will be further described below with reference to the accompanying drawings and the embodiments.

Embodiment

As shown in figures, a high-resistance resistor based on silicon carbide includes a semi-insulating 4H—SiC silicon carbide substrate, a silicon surface and a carbon surface of the silicon carbide substrate are provided with symmetrical atomic-thickness aluminum oxide insulating layers, thicknesses of the aluminum oxide insulating layers are 0.2 nm-2 nm, and aluminum oxide insulating modified layers are configured to adjust contact characteristics between metal electrodes and the silicon carbide substrate, such that desirable ohmic contact is formed between the metal electrodes and silicon carbide.

Conductive metal electrodes are formed at two sides of the aluminum oxide insulating layers through evaporation, and thicknesses of the metal electrodes are 100 nm-500 nm. The metal electrodes are made of one or more of gold, silver, copper and aluminum.

A manufacturing method of a high-resistance resistor based on silicon carbide includes:

Step 1: a semi-insulating 4H—SiC silicon carbide substrate having a thickness of 500 μm and a volume resistivity of $10^{12}$ Ω·cm or more was selected as a substrate, and a carbon surface and a silicon surface of the substrate were marked by means of an atomic force microscope.

Step 2: the silicon carbide substrate was cleaned and dried, and the carbon surface and the silicon surface of the silicon carbide substrate were gently rubbed repeatedly by means of disposable gloves until the carbon surface and the silicon surface were washed with deionized water to form a uniform water film; and the silicon carbide substrate was placed in an ultrasonic cleaner, the silicon carbide substrate was ultrasonically cleaned with deionized water, acetone and isopropanol separately for 15 min, and the silicon carbide substrate was washed for later use.

Step 3: an atomic layer deposition technology or a magnetron sputtering technology was used to deposit 0.2 nm-2 nm of aluminum oxide insulating layers on the carbon surface and silicon surface of the silicon carbide substrate respectively, and when the atomic layer deposition technology was used, thicknesses of the aluminum oxide insulating layers were regulated by controlling the number of cycles.

Step 4, electrode masks were stuck on two sides of the deposited aluminum oxide insulating layers respectively, and covering areas of the electrode masks were determined according to a resistance of a resistor to be manufactured, where effective areas of the electrodes determine a cross-sectional area of the resistor, the larger the area, the lower the resistance of the manufactured resistor, and the cross-sectional area ranges from μm² to mm².

Step 5: silicon carbide having stuck masks was placed in a cavity of a magnetron sputtering instrument, and a layer of metal electrode having a thickness of 100 nm-500 nm was sprayed on each of a carbon surface and a silicon surface of silicon carbide having deposited aluminum oxide through magnetron sputtering, where the metal electrodes were made of one or more of gold, silver, copper and aluminum.

Figure 3:
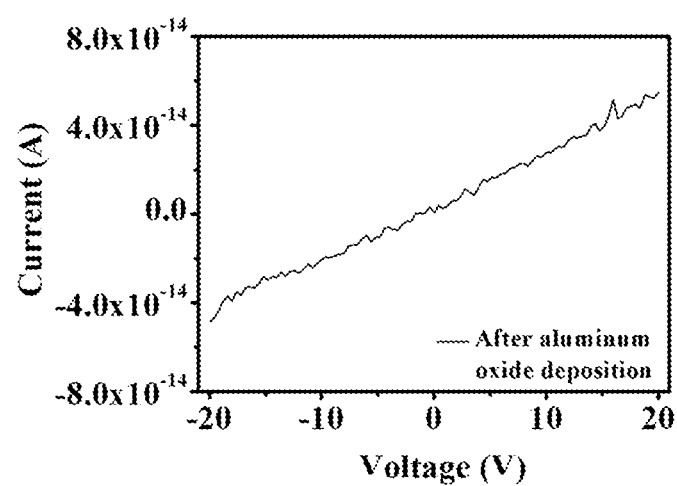
FIG. 3 is a volt-ampere characteristic curve of the high-resistance resistor based on silicon carbide, with an electrode area of 500×500 μm² after aluminum oxide deposition in the present disclosure, a resistance being about 400 TΩ.

Step 6: a sample was taken out from a coating chamber and the masks were removed, so as to obtain the high-resistance resistor based on silicon carbide, and volt-ampere characteristics of the manufactured resistor were tested by means of a Keysight B1500 semiconductor analyzer. It may be seen from FIG. 3 that a volt-ampere characteristic curve of an ohmic contact characteristic of a high resistance is obtained.

Compared with the prior art, the present disclosure has the following beneficial effects:

The silicon carbide is a highly stable semiconductor material, compared with traditional high-resistance materials, such as a metal oxide film and an organic material, the silicon carbide is capable of withstanding extreme environments having a high temperature, high voltage, high frequency, strong radiation, etc., and the high-resistance resistor based on silicon carbide is suitable for precision testing in an extreme environment.

Before the metal electrodes are made on the silicon carbide substrate, introduction of an atomic-thickness aluminum oxide interface modified layer is conducive to obtaining of a volt-ampere characteristic curve having an ohmic contact characteristic. The effective areas of the electrodes are adjusted to directly adjust the resistance. The high-resistance resistor obtained through the method is conducive to direct monolithic integration with a silicon carbide transistor, thus promoting development of a silicon carbide integrated circuit technology.

Finally, it should be noted that the above embodiments are merely used to describe the technical solution of the present disclosure, rather than limiting the same. Although the present disclosure has been described in detail with reference to the preferred embodiments, those of ordinary skill in the art should understand that the technical solution of the present disclosure may still be modified or equivalently replaced. However, these modifications or equivalent replacement cannot make the modified technical solution deviate from the spirit and scope of the technical solution of the present disclosure.

What is claimed is:

1. A high-resistance resistor based on silicon carbide, comprising:
   a semi-insulating 4H—SiC silicon carbide substrate; wherein a silicon surface and a carbon surface of the semi-insulating 4H—SiC silicon carbide substrate are provided with aluminum oxide insulating layers, wherein the aluminum oxide insulating layers are symmetrical and atomic-thickness; thicknesses of the aluminum oxide insulating layers are 0.2 nm-2 nm; conductive metal electrodes are formed at two sides of the aluminum oxide insulating layers through evaporation; and thicknesses of the conductive metal electrodes are 100 nm-500 nm.

2. The high-resistance resistor based on silicon carbide according to claim 1, wherein the conductive metal electrodes are made of at least one selected from the group consisting of gold, silver, copper and aluminum.

3. A manufacturing method of the high-resistance resistor based on silicon carbide according to claim 1, comprising:
   step 1: selecting the semi-insulating 4H—SiC silicon carbide substrate having a certain thickness and resistivity; marking the carbon surface and the silicon surface of the semi-insulating 4H—SiC silicon carbide substrate by an atomic force microscope;
   step 2: cleaning and drying the semi-insulating 4H—SiC silicon carbide substrate; gently rubbing a front face and a back face of the semi-insulating 4H—SiC silicon carbide substrate repeatedly by disposable gloves until the front face and the back face are washed with deionized water to form a uniform water film; then placing the washed semi-insulating 4H—SiC silicon carbide substrate in an ultrasonic cleaner; ultrasonically cleaning the semi-insulating 4H—SiC silicon carbide substrate with the deionized water, acetone and isopropanol separately each for 15 minutes; and washing the semi-insulating 4H—SiC silicon carbide substrate for later use;
   step 3: using an atomic layer deposition technology or a magnetron sputtering technology to deposit 0.2 nm-2 nm of the aluminum oxide insulating layers on the carbon surface and the silicon surface of the semi-insulating 4H—SiC silicon carbide substrate respectively;
   step 4: sticking electrode masks on two sides of the deposited aluminum oxide insulating layers respectively; determining covering areas of the electrode masks according to a resistance of a high-resistance resistor to be manufactured;
   step 5: placing the semi-insulating 4H—SiC silicon carbide substrate having stuck electrode masks in a cavity of a magnetron sputtering instrument; spraying a layer of the conductive metal electrode having the thickness of 100 nm-500 nm on each of the silicon surface and the carbon surface of the semi-insulating 4H—SiC silicon carbide substrate through magnetron sputtering; wherein the silicon surface and the carbon surface have the deposited aluminum oxide insulating layers; wherein the conductive metal electrode is made of at least one selected from the group consisting of gold, silver, copper and aluminum; and
   step 6: taking out a sample from a coating chamber and removing the electrode masks to obtain the high-resistance resistor based on silicon carbide; and testing volt-ampere characteristics of the high-resistance resistor by a semiconductor analyzer.

4. A manufacturing method of the high-resistance resistor based on the semi-insulating 4H—SiC silicon carbide according to claim 2, comprising:
   step 1: selecting the semi-insulating 4H—SiC silicon carbide substrate having a certain thickness and resistivity; marking the carbon surface and the silicon surface of the semi-insulating 4H—SiC silicon carbide substrate by an atomic force microscope;
   step 2: cleaning and drying the semi-insulating 4H—SiC silicon carbide substrate; gently rubbing a front face and a back face of the semi-insulating 4H—SiC silicon carbide substrate repeatedly by disposable gloves until the front face and the back face are washed with deionized water to form a uniform water film; then placing the washed semi-insulating 4H—SiC silicon carbide substrate in an ultrasonic cleaner; ultrasonically cleaning the semi-insulating 4H—SiC silicon carbide substrate with the deionized water, acetone and isopropanol separately each for 15 minutes; and washing the semi-insulating 4H—SiC silicon carbide substrate for later use;
   step 3: using an atomic layer deposition technology or a magnetron sputtering technology to deposit 0.2 nm-2 nm of the aluminum oxide insulating layers on the carbon surface and the silicon surface of the semi-insulating 4H—SiC silicon carbide substrate respectively;
   step 4: sticking electrode masks on two sides of the deposited aluminum oxide insulating layers respectively; determining covering areas of the electrode masks according to a resistance of a high-resistance resistor to be manufactured;
   step 5: placing the semi-insulating 4H—SiC silicon carbide substrate having stuck electrode masks in a cavity of a magnetron sputtering instrument; spraying a layer of the conductive metal electrode having the thickness of 100 nm-500 nm on each of the silicon surface and the carbon surface of the semi-insulating 4H—SiC silicon carbide substrate through magnetron sputtering;

wherein the silicon surface and the carbon surface have the deposited aluminum oxide insulating layers; wherein the conductive metal electrode is made of at least one selected from the group consisting of gold, silver, copper and aluminum; and step 6: taking out a sample from a coating chamber and removing the electrode masks to obtain the high-resistance resistor based on silicon carbide; and testing volt-ampere characteristics of the high-resistance resistor by a semiconductor analyzer.

\* \* \* \* \*